US009105357B2

(12) United States Patent
Namai et al.

(10) Patent No.: US 9,105,357 B2
(45) Date of Patent: Aug. 11, 2015

(54) SEMICONDUCTOR MEMORY DEVICE AND DEFECTIVE JUDGING METHOD THEREOF

(71) Applicant: KABUSHIKI KAISHA TOSHIBA, Minato-ku (JP)

(72) Inventors: Yuzuru Namai, Kawasaki (JP); Manabu Sato, Chigasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/204,165

(22) Filed: Mar. 11, 2014

(65) Prior Publication Data
US 2015/0071000 A1    Mar. 12, 2015

Related U.S. Application Data

(60) Provisional application No. 61/875,149, filed on Sep. 9, 2013.

(51) Int. Cl.
*G11C 7/04*   (2006.01)
*G11C 29/12*  (2006.01)

(52) U.S. Cl.
CPC ............................. G11C 29/12005 (2013.01)

(58) Field of Classification Search
CPC . G11C 29/003; G11C 29/025; G11C 16/0483
USPC ........... 365/185.17, 185.09, 211, 200, 189.07
See application file for complete search history.

(56) References Cited

U.S. PATENT DOCUMENTS 7,245,526 B2 *   7/2007  Oh et al. ........................ 365/163
2013/0194868 A1 *  8/2013  Hashimoto .............. 365/185.11

* cited by examiner

*Primary Examiner* — Andrew Q Tran
(74) *Attorney, Agent, or Firm* — Oblon, McClelland, Maier & Neustadt, L.L.P.

(57) ABSTRACT

A semiconductor memory device is provided with a plurality of memory cells connected to a plurality of word lines, a word-line leakage detector configured to detect a leakage current generated on at least one of the plurality of word lines, and a controller configured, when a leakage current is detected by the word-line leakage detector, to determine that a block including a memory cell connected to a word line through which the leakage current is flowing is defective. The word-line leakage detector has a detection voltage generator configured to generate a detection voltage in accordance with the leakage current, a comparator configured to generate a flag signal having output logic that is inverted depending on whether the detection voltage exceeds a predetermined threshold voltage, and an adjuster configured to adjust a current amount by diverting part of the leakage current in accordance with an ambient temperature.

18 Claims, 20 Drawing Sheets

US 9,105,357 B2

SEMICONDUCTOR MEMORY DEVICE AND DEFECTIVE JUDGING METHOD THEREOF

CROSS REFERENCE TO RELATED APPLICATIONS

This application is based upon and claims the benefit of U.S. provisional Application No. 61/875,149, filed on Sep. 9, 2013, the entire contents of which are incorporated herein by reference.

FIELD

An embodiment of the present invention relates to a semiconductor memory device capable of detecting a leakage current of a word line.

BACKGROUND

Word line leakage has become a big problem for memory chips such as a NAND flash memory, as miniaturization has proceeded in a fabrication process and memory capacity has become larger. For this reason, a word-line leakage detection circuit is provided within a memory chip. There is a technique in which a leakage current detected by a word-line leakage detection circuit is compared with a predetermined threshold value and it is determined to be a leakage fault when the leakage current exceeds the predetermined threshold value.

A leakage current flowing through a word line varies depending on an ambient temperature. For example, in general, as an ambient temperature rises, a leakage current becomes larger. Therefore, when an ambient temperature rises, even a chip that is not defective may be erroneously determined to be defective.

DETAILED DESCRIPTION

A semiconductor memory device according to an embodiment is provided with a plurality of memory cells connected to each of a plurality of word lines, a word-line leakage detector configured to detect a leakage current generated on at least one of the plurality of word lines, and a controller configured, when a leakage current is detected by the word-line leakage detector, to determine that a block including a memory cell connected to a word line through which the leakage current flows is defective. The word-line leakage detector has a detection voltage generator configured to generate a detection voltage in accordance with the leakage current, a comparator configured to generate a flag signal having output logic inverted depending on whether the detection voltage exceeds a predetermined threshold voltage, and an adjuster configured to adjust a current amount by diverting part of the leakage current in accordance with an ambient temperature.

Hereinafter, an embodiment of the present invention will be explained.

First Embodiment

Figure 1:
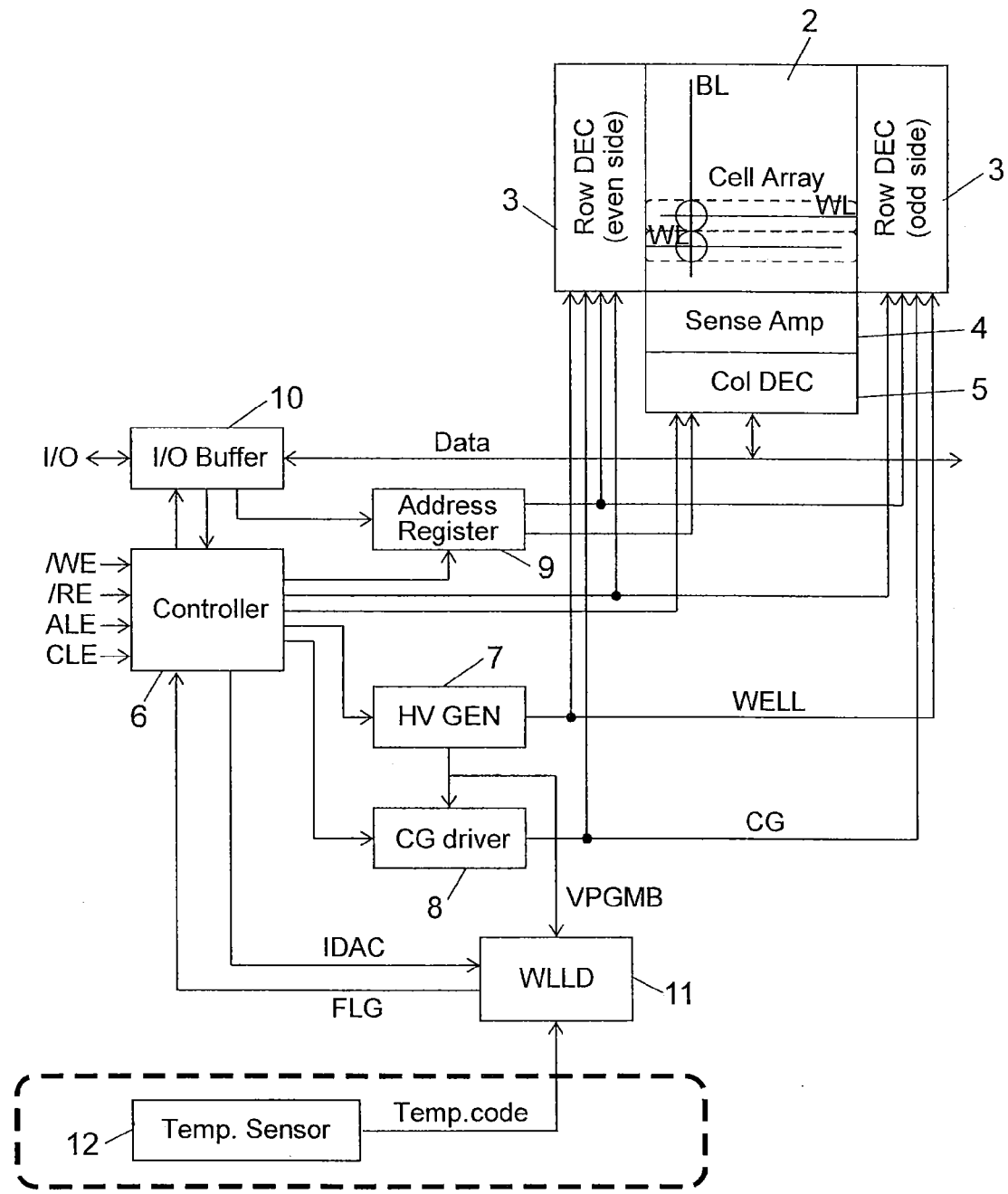
FIG. 1 is a block diagram of a semiconductor memory device 1 according to a first embodiment.

FIG. 1 is a block diagram of a semiconductor memory device 1 according to a first embodiment. FIG. 1 shows a NAND flash memory as an example of the semiconductor memory device 1.

The semiconductor memory device 1 of FIG. 1 is provided with a cell array 2, a row decoder 3, sense amplifiers (S/A) 4, a column decoder 5, a controller 6, a high voltage generator 7, a CG driver 8, an address register 9, an I/O buffer 10, and a word-line leakage detector (WLLD) 11. In addition, the semiconductor memory device 1 of FIG. 1 has a built-in temperature sensor 12 or an input interface that receives a signal from a temperature sensor 12 provided outside the semiconductor memory device 1. The temperature sensor 12 measures an ambient temperature of the semiconductor memory device 1 and outputs a digital signal (Temp code) in accordance with the measured ambient temperature.

Figure 2:
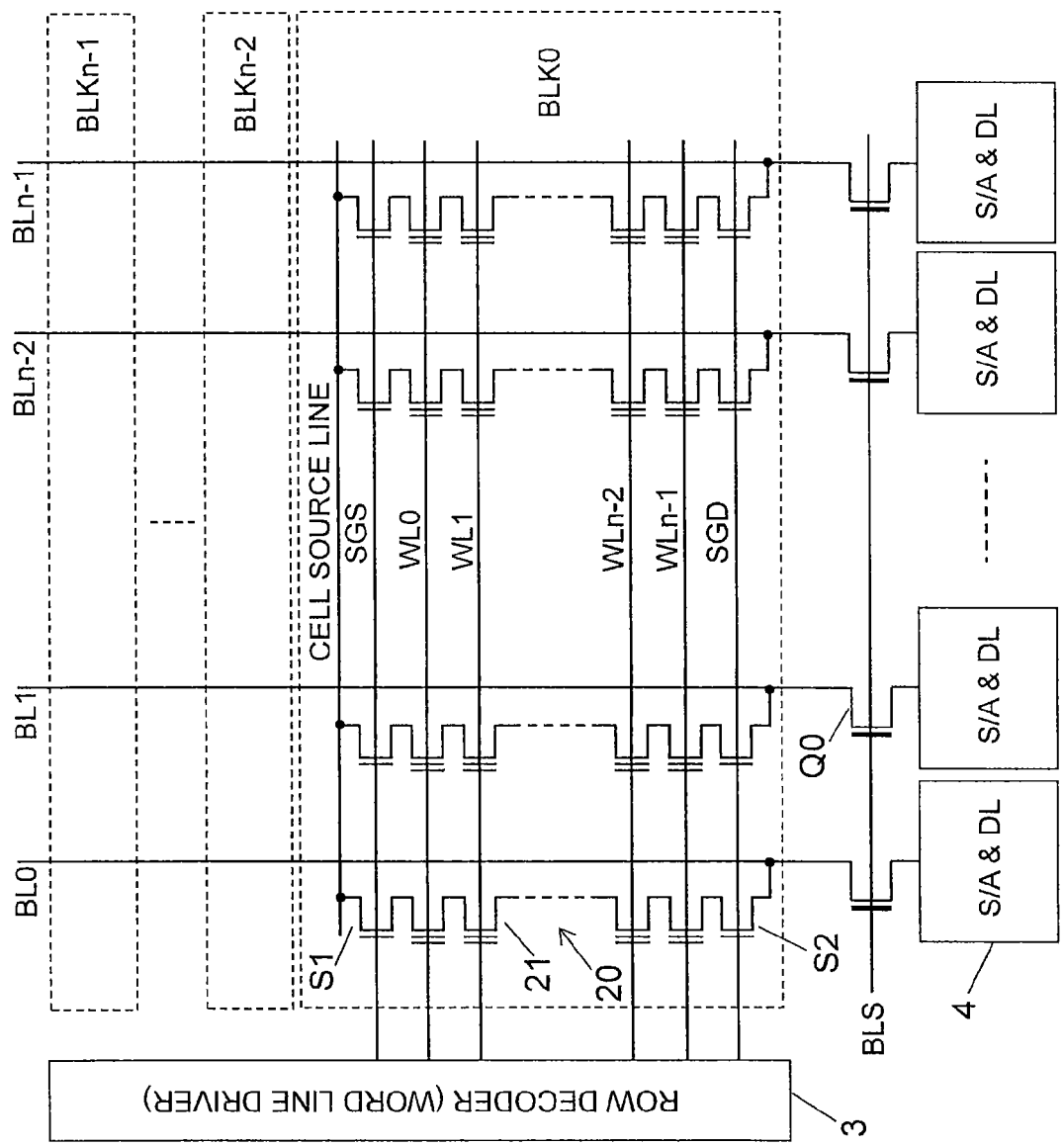
FIG. 2 is a block diagram of circuits provided around a cell array 2.

The cell array 2 has NAND strings 20 each having a plurality of series-connected memory cells. FIG. 2 is a block diagram of circuits provided around the cell array 2. As shown in FIG. 2, the cell array 2 is divided into a plurality of blocks BLK0 to BLKn−1. Each block has a plurality of NAND strings 20 described above arranged in a column direction. Each NAND string 20 has a plurality of series-connected memory cells 21, a selection gate transistor S1 connected to one end of the memory cells 21, and a selection gate transistor S2 connected to the other end of the memory cells 21.

The gates of the memory cells 21 in each NAND string 20 are connected to the corresponding word lines WL0 to WLn−1, respectively. The gate of the selection gate transistor S1 is connected to a selection gate line SGS. The gate of the selection gate transistor S2 is connected to a selection gate line SGD. Each NAND string 20 is connected to a common cell source line via the corresponding selection gate transistor S1. The NAND strings 20 are connected to the corresponding bit lines BL0 to BLn−1 via the corresponding selection gate transistors S2, respectively.

Word lines WL0 to WLn−1 connected to the gates of the respective memory cells 21 in each NAND string 20 are connected to the row decoder 3. The row decoder 3 decodes a row address transferred from the address register 9. The CG driver 8 generates a voltage for driving each word line based on decoded data.

The bit lines BL0 to BLn−1 connected to the respective NAND strings 20 are connected to the sense amplifiers 4, respectively, via bit-line selection transistors Q0. Read data detected by each sense amplifier 4 is latched by a data latch circuit paired with each sense amplifier, as binary data, for example.

The column decoder 5 shown in FIG. 1 decodes a column address from the address register 9. Moreover, based on this decoded result, the column decoder 5 determines whether to transfer data latched by the data latch circuits to a data bus.

The I/O buffer 10 buffers an address, data, and a command input from I/O terminals. Moreover, the I/O buffer 10 transfers an address, a command, and data to the address register 9, a command register, and a data bus, respectively.

The controller 6 distinguishes between an address and a command and controls operations of the sense amplifiers 4 described above, the word-line leakage detector 11, etc.

The word-line leakage detector 11 detects a leakage current generated on at least one of a plurality of word lines.

Figure 3:
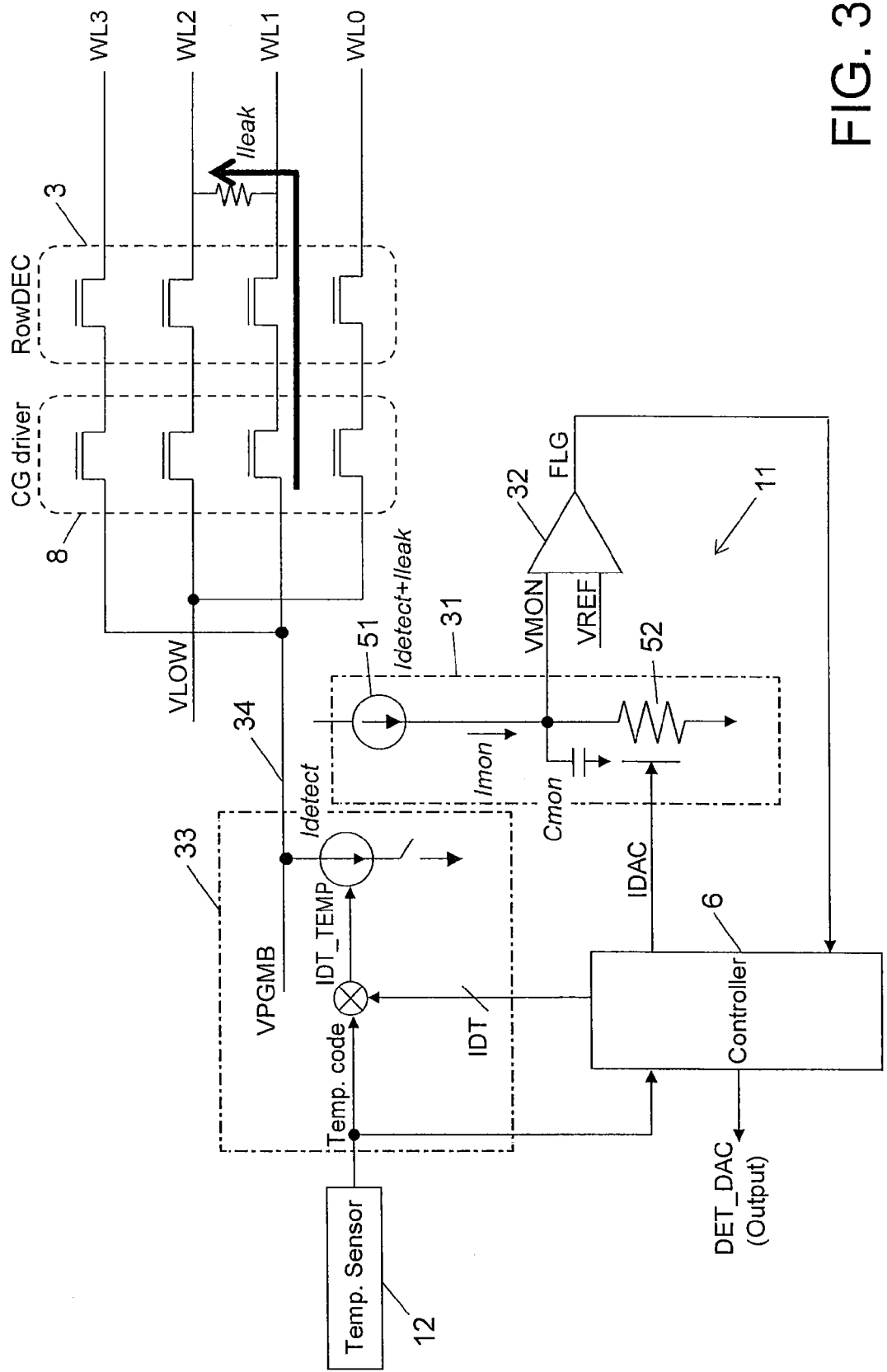
FIG. 3 is a block diagram of a word-line leakage detector 11.

FIG. 3 is a block diagram of the word-line leakage detector 11. The word-line leakage detector 11 of FIG. 3 has a detection voltage generator 31, a comparator 32, and an adjuster 33.

The word-line leakage detector 11 is connected to a leakage path 34 of word lines. The leakage path 34 is a current path of a current flowing from the word lines via the row decoder 3 and the CG driver 8.

The detection voltage generator 31 generates a detection voltage in accordance with a leakage current (hereinafter, a word-line leakage current) flowing through the word lines. The comparator 32 generates a flag signal FLG whose output logic is inverted according to whether a detection voltage exceeds a specific threshold value. The adjuster 33 diverts part of a leakage current so that the current flowing through the detection voltage generator 31 approaches a constant value irrespective of an ambient temperature.

The leakage current flowing through the word lines includes a first leakage current flowing through the adjuster 33 and a second leakage current flowing through the detection voltage generator 31. The adjuster 33 adjusts the first leakage current in accordance with an ambient temperature so that the second leakage current approaches a constant value irrespective of the ambient temperature.

Figure 4:
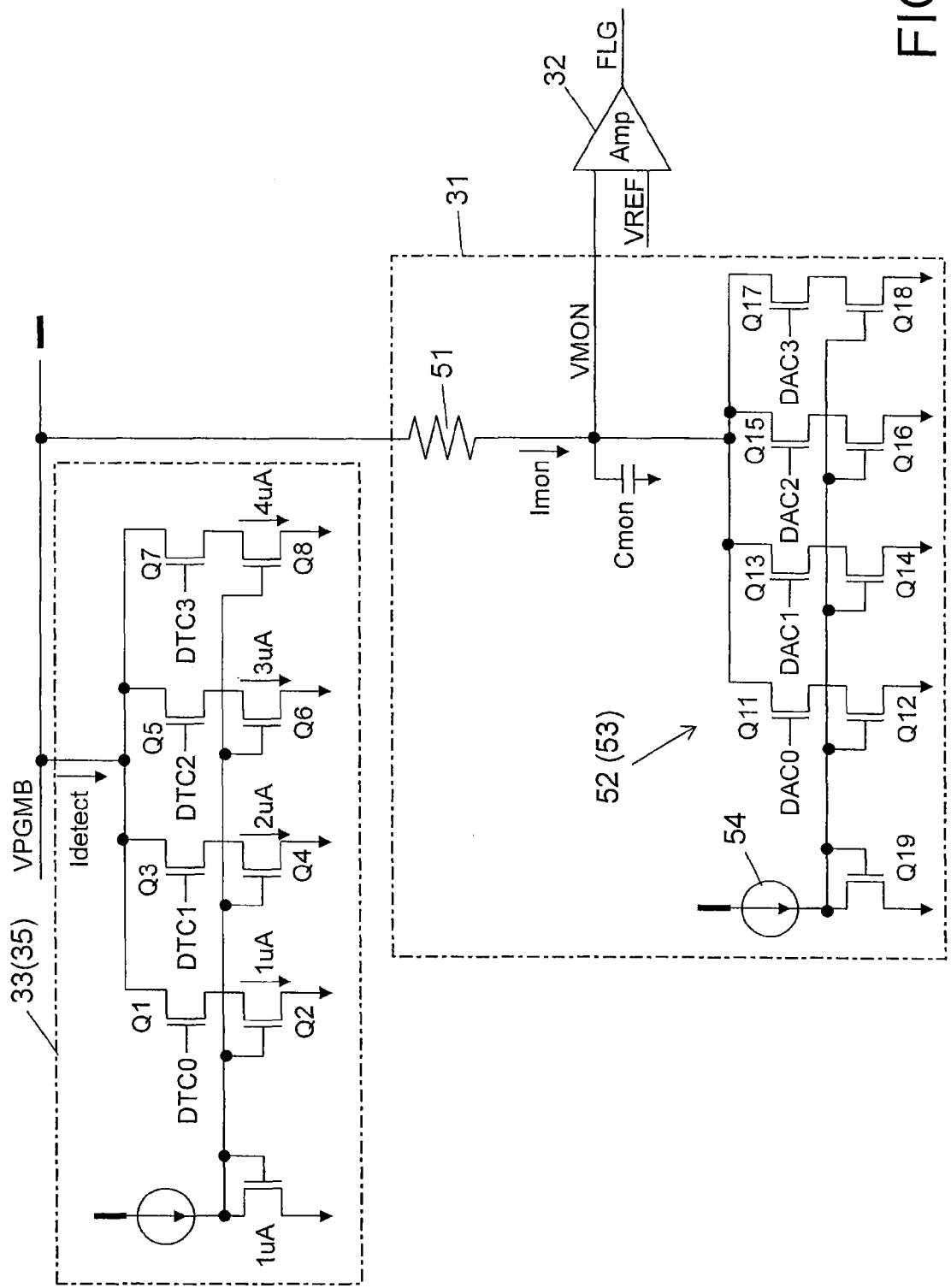
FIG. 4 is a circuit diagram showing an example of a detection voltage generator 31 and an adjuster 33.

FIG. 4 is a circuit diagram showing an example of the detection voltage generator 31 and the adjuster 33. The adjuster 33 of FIG. 4 has a current-mirror current generation circuit 35 that can control a current value with a control signal DTC [0:3]. The current generation circuit 35 makes a current from a VPGMB node flow to transistors Q1 and Q2 when a control signal DTC0 is 1, with a current value of 1 μA, for example. The current generation circuit 35 makes a current from the VPGMB node flow to transistors Q3 and Q4 when a control signal DTC1 is 1, with a current value of 2 μA, for example. The current generation circuit 35 makes a current from the VPGMB node flow to transistors Q5 and Q6 when a control signal DTC2 is 1, with a current value of 3 μA, for example. The current generation circuit 35 makes a current from the VPGMB node flow to transistors Q7 and Q8 when a control signal DTC3 is 1, with a current value of 4 μA, for example.

The current generation circuit 35 in the adjuster 33 switches two or more DTCs [0:3] to 1 to make the flow of a current having a current value obtained by adding an arbitrary current within 1 μA to 4 μA.

The values of DTCs [0:3] are set based on a fixed bit string IDT [0:1] that is set at shipping from a factory and a temperature-dependent bit string TCO [0:1] that is set in accordance with an ambient temperature measured by the temperature sensor 12.

Figure 5:
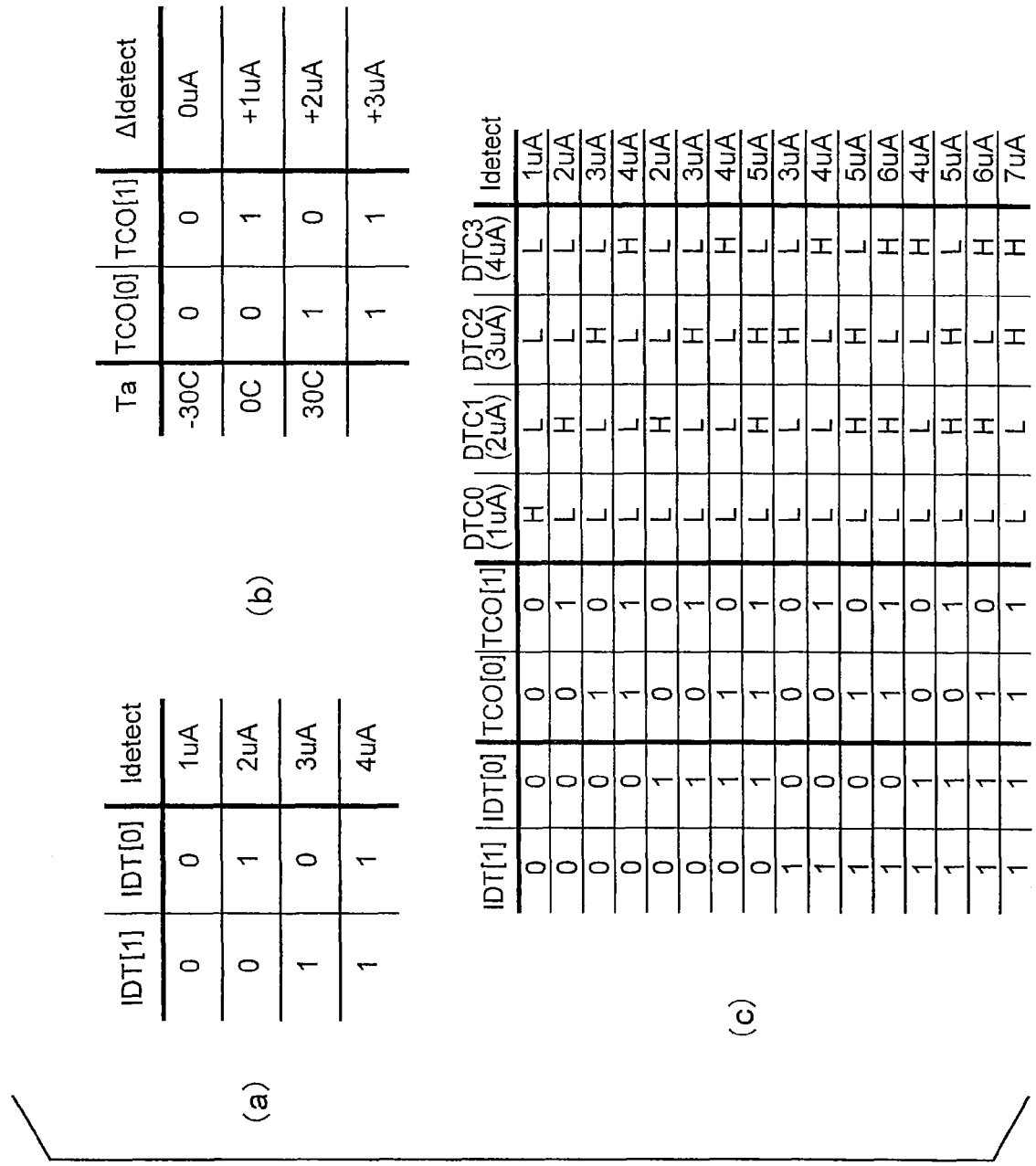
FIGS. 5(a), 5(b) and 5(c) show requirements for setting a first leakage current.

FIG. 5($a$) is a view showing the correspondence between the fixed bit string IDT [0:1] and a constant leakage current Idetect flowing through the adjuster 33. There is a variation in electrical characteristics among memory chips. Therefore, a constant leakage current Idetect to be flown to the adjuster 33 is set and then a fixed bit string IDT [0:1] in accordance with the set constant leakage current Idetect is set for each memory chip at shipping from a factory. As shown in FIG. 5($a$), by a bit combination of a bit string of IDT [0:1], four different constant leakage currents Idetect can be set.

FIG. 5($b$) is a view showing the correspondence between the temperature-dependent bit string IDT [0:1] and a temperature-dependent leakage current Idetect flowing through the adjuster 33. Adjusting amounts for the temperature-dependent leakage current Idetect are provided corresponding to four different temperature ranges.

As shown in FIG. 5($c$), by a combination of the fixed bit string IDT [0:1] and the temperature-dependent bit string TCO [0:1], a total current value of the first leakage current Idetect is decided. The current value of the first leakage current Idetect includes a current adjusting amount given by the temperature-dependent bit string TCO [0:1], and therefore fluctuates depending on an ambient temperature.

As shown in FIG. 5($c$), there are a plurality of combinations of the fixed bit string IDT [0:1] and the temperature-dependent bit string TCO [0:1] in which the first leakage current Idetect becomes the same current value. The fixed bit string IDT [0:1] is set at shipping from a factory and cannot be changed thereafter. Therefore, by adjusting the bit string of the temperature-dependent bit string TCO [0:1], the first leakage current Idetect is set to a desired current value.

Figure 6:
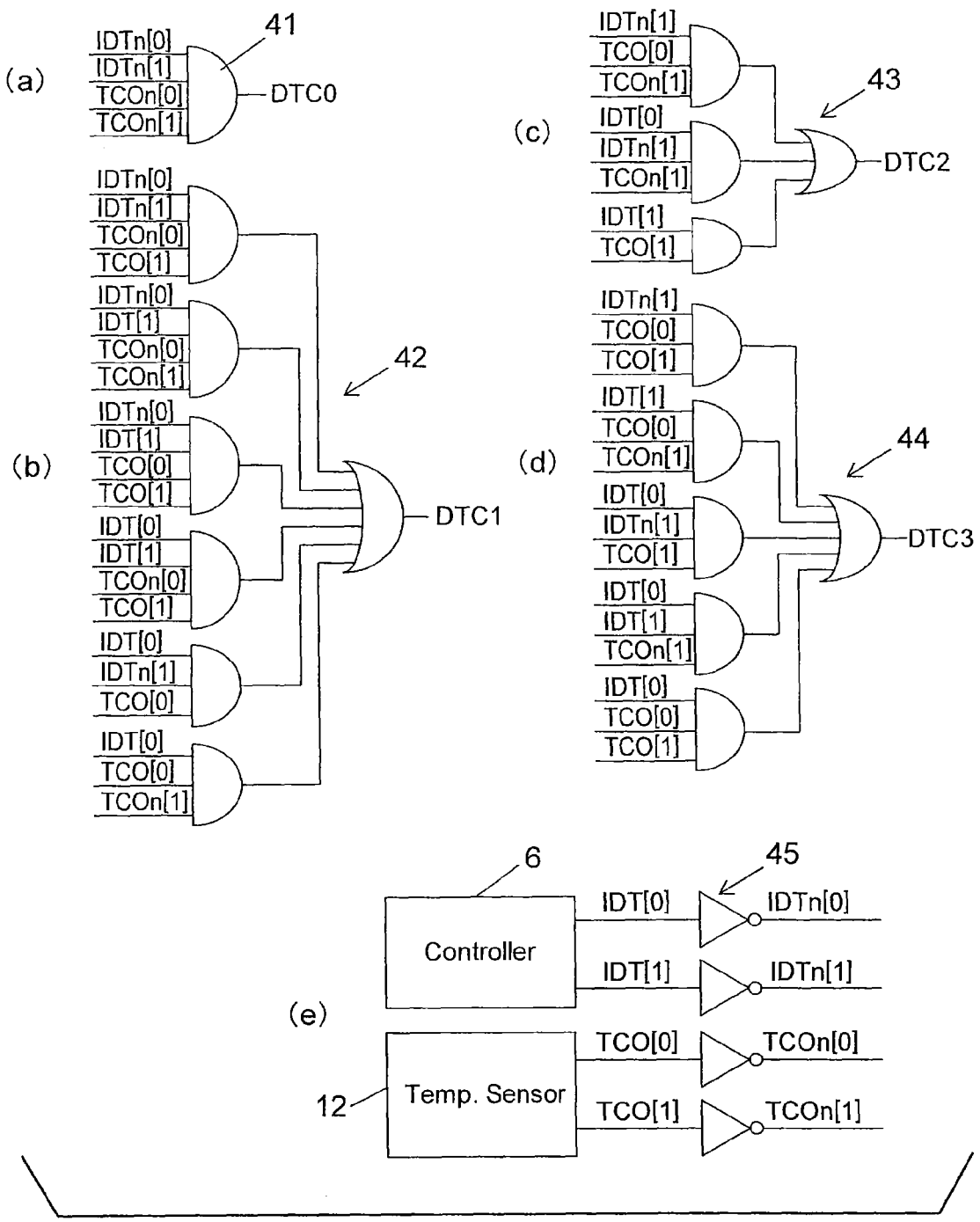
FIG. 6 is a circuit diagram showing an example of a logic circuit for realizing the logic in a truth table of FIG. 5(c)

The logic in a truth table shown in FIG. 5($c$) is realized by a logic circuit of, for example, a circuit diagram shown in FIG. 6. A gate signal DTC0 of the transistor Q1 of FIG. 4 can be generated by a logic circuit 41 having a 4-input AND gate as shown in FIG. 6($a$). Likewise, gate signals DTC1, DTC2 and DTC3 of the transistors Q3, Q5 and Q7 of FIG. 4 can be generated by logic circuits 42, 43 and 44 such as shown in FIGS. 6($a$), 6($b$) and 6($c$), respectively. The input signals of these logic circuits are IDT[0:1] or TCO[0:1] shown in FIG. 5($c$), or signals IDTn[0:1] or TCOn[0:1] that are obtained by inverting IDT[0:1] or TCO[0:1] by an inverter 45 of FIG. 6($e$).

The logic circuit for realizing the logic in the truth table shown in FIG. 5($c$) is not limited to the circuit shown in FIG. 6.

Moreover, in FIGS. 3 to 6, the fixed bit string IDT [0:1] and the temperature-dependent bit string TCO have two bits each. However, each bit string may have three or more bits. As the number of bits increases, finer adjustments can be done for the first leakage current Idetect. However, the current source and the logic circuit for realizing the finer adjustments have a more complex circuit configuration.

According to the circuits of FIGS. 3 and 6, the first leakage current Idetect flowing through the adjuster 33 can be adjusted in accordance with an ambient temperature. In more specifically, based on temperature measured data TCO[0:1] measured by the temperature sensor 12, as an ambient temperature becomes higher, the first leakage current Idetect can be increased.

Figure 7:
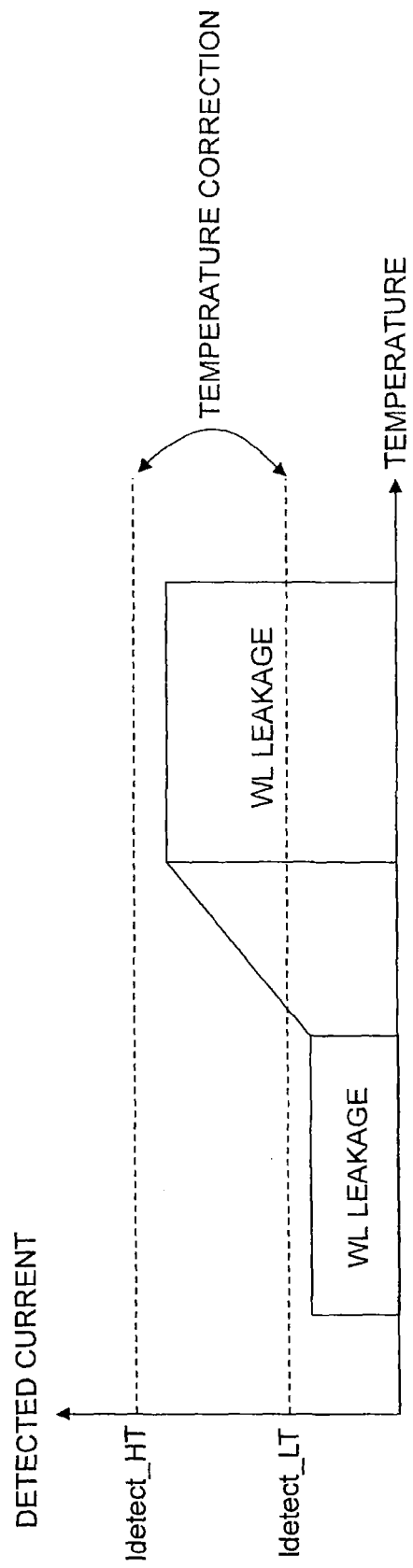
FIG. 7 is a view showing the relationship between an ambient temperature and a first leakage current Idetect.

FIG. 7 is a view showing the relationship between an ambient temperature and the first leakage current Idetect. As shown in FIG. 7, as an ambient temperature becomes higher, a leakage current flowing through a word line increases. As the leakage current increases, the first leakage current Idetect flowing through the adjuster 33 is increased. Therefore, even if a word-line leakage current increases due to the rise of ambient temperature, there is no possibility of erroneously determining a fault due to the increase in word-line leakage current.

In this embodiment, an increased amount of a word-line leakage current due to the rise of ambient temperature is flown to the adjuster 33, as a first leakage current. Therefore, it is possible to hold a second leakage current flowing through the detection voltage generator 31 to be almost constant irrespective of an ambient temperature.

As shown in FIG. 3, the detection voltage generator 31 has a first impedance element 51 and a second impedance element 52. As the first impedance element 51, a current mirror element that makes a current (=Idetect+Ileakage) at a VPGMB node flow is used. Specifically, for example, a first current mirror circuit 64 of FIG. 10 which will be described later is used. As the second impedance element 52, for example, a variable resistor having transistors and the like is used.

The second impedance element 52 varies the resistance value based on an IDAC signal from the controller 6 to adjust a current flowing through the second impedance element 52.

A capacitor Cmon is connected between an intermediate node of the first and second impedance elements 51 and 52, and a ground node. A voltage VMON at the intermediate node is input to the comparator 32 to compare the voltage VMON with a reference voltage VREF. The comparator 32 generates a flag signal FLG that changes its logic depending on one higher between the voltage VMON and the reference voltage VREF and supplies the flag signal FLG to the controller 6.

As the second impedance element 52, as shown in FIG. 4, a current-mirror current generation circuit 53 is used. The current-mirror current generation circuit 53 has transistors Q11 and Q12, transistors Q13 and Q14, transistors Q15 and Q16, and transistors Q17 and Q18, connected in parallel between a VMON node and a ground node, a transistor Q19 connected to these transistors in a current-mirror configuration, and a current source 54 connected to the transistor 19 in series.

To the gate of each of the transistors Q11, Q13, Q15 and Q17, IDAC[0:3] is input from the controller 6. By varying the bit value of IDAC[0:3], currents flowing through the transistors Q11 to Q18 can be adjusted so that the transistors Q11 to Q18 function as a variable resistor.

When a current Imon flowing through the first impedance element 51 becomes larger than a current flowing through the second impedance element 52, electric charges are charged into a capacitor Cmon and a voltage VMON increases accordingly.

The controller 6 decreases the bit string of an IDAC signal in succession starting from the maximum value. When the bit string of the IDAC signal reaches a certain bit value, charging to the capacitor Cmon starts. The controller 6 stores the value of the IDAC signal at which the voltage VMON becomes higher than a reference voltage VREF.

As the leakage current is larger, the current Imon flowing through the first impedance element 51 becomes larger to vary the IDAC signal by which charging to the capacitor Cmon starts. Therefore, the controller 6 can determine whether there is a leakage current by the bit value of the IDAC signal at which charging to the capacitor Cmon starts.

Figure 8:
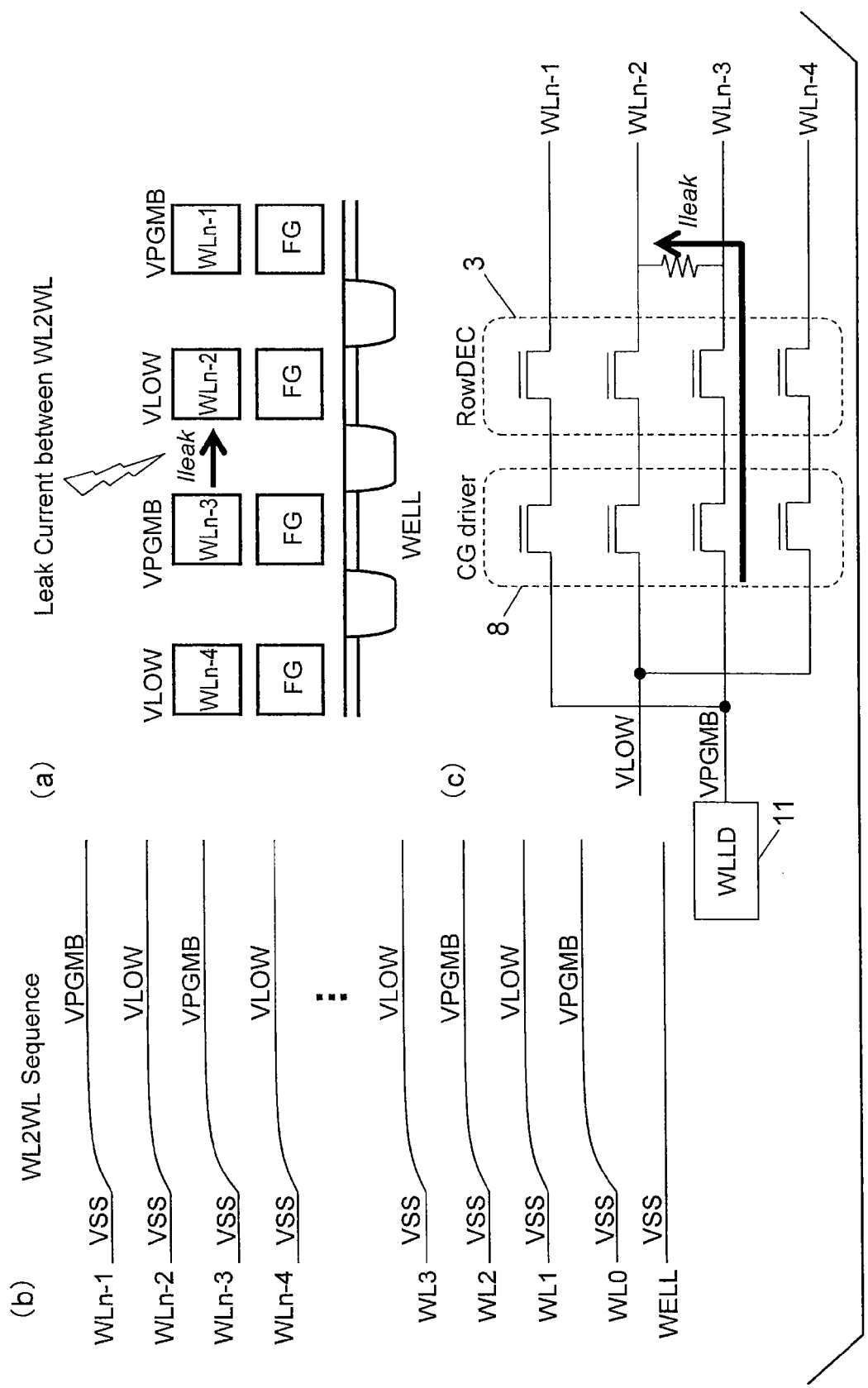
FIGS. 8(a), 8(b) and 8(c) show a leakage fault between adjacent two word lines.
Figure 9:
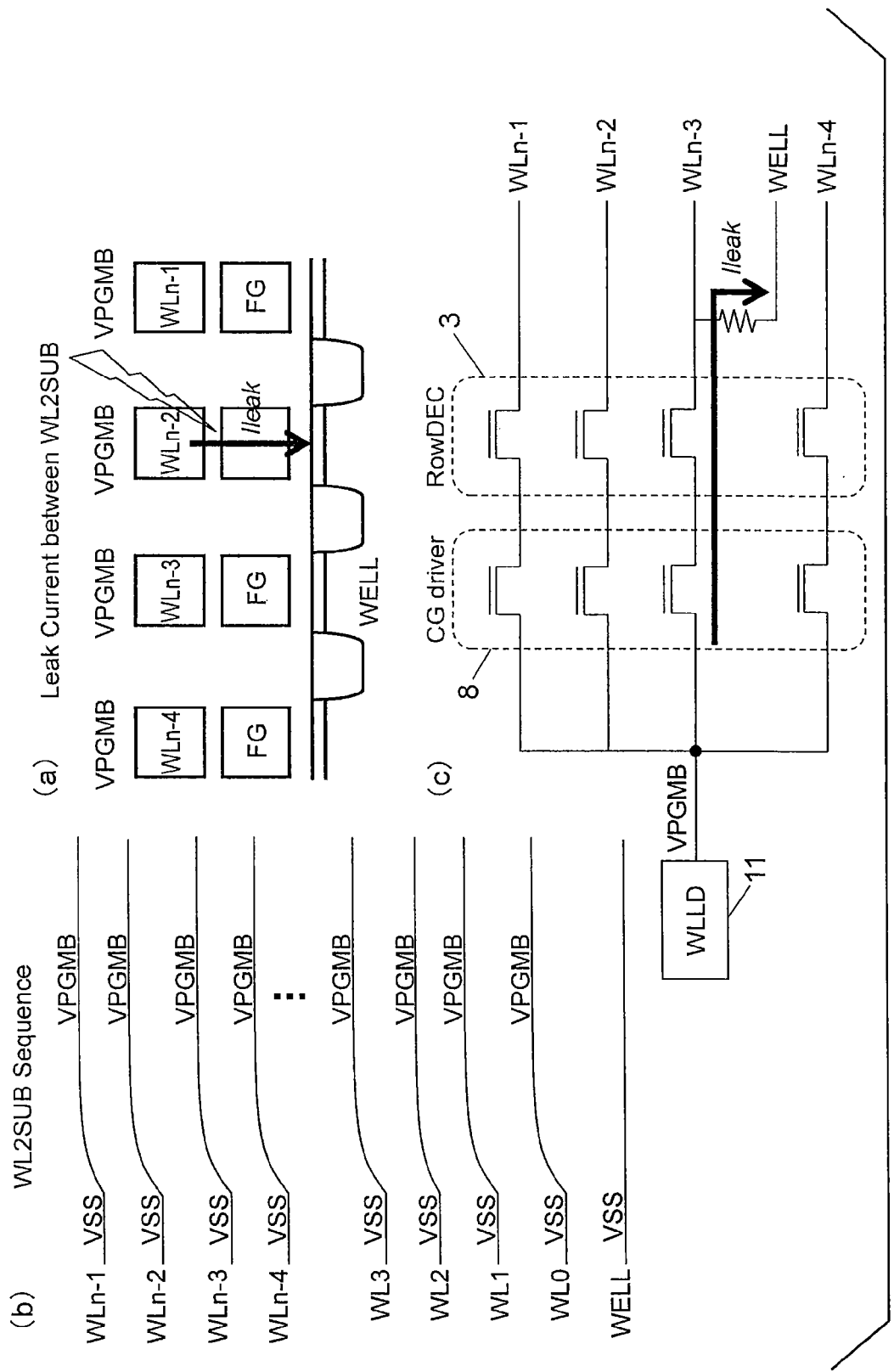
FIGS. 9(a), 9(b) and 9(c) show a leakage fault between a word line and a substrate.

FIGS. 8 and 9 are views showing the leakage path 34. FIG. 8(a) shows an example in which there is a leakage path between adjacent two word lines. In order to detect a leakage current in this case, as shown in FIG. 8(b), a high voltage VPGMB is applied to either of the adjacent two word lines and a low voltage VLOW is applied to the other. In this way, as shown in FIG. 8(c) with an arrow, a leakage current flows between adjacent two word lines. Therefore, this leakage current can be detected by the word line leakage detector 11.

FIG. 9(a) shows an example in which there is a leakage path between a word line and a substrate. In order to detect a leakage current in this case, for example, as shown in FIG. 8(b), a high voltage VPGMB is applied to all of the word lines in a block and a well region of the substrate is set at a low voltage VSS. In this way, as shown in FIG. 9(c) with an arrow, a leakage current flows from a word line having a leakage path to the well region. Therefore, this leakage current can be detected by the word-line leakage detector 11.

In each case of FIGS. 8 and 9, a leakage current flows through the word-line leakage detector 11. Therefore, it is possible to reflect the effects of an ambient temperature in a leakage specification using the circuit of FIG. 3 described above, thereby correctly detecting whether there is a leakage fault.

Concerning the leakage path 34, not only those shown in FIGS. 8 and 9, there is a path of a leakage current flowing from a word line to a wiring layer above the word line. A leakage current in this case also flows to the word-line leakage detector 11 and hence can be detected by the word-line leakage detector 11 described above.

The controller 6 determines that a leakage fault has occurred based on a flag signal FLG from the word-line leakage detector 11. When the controller 6 determines that a leakage fault has occurred, the controller 6 acknowledges that the entire block that includes a word line that causes a leakage fault is defective and inhibits access to this block. Here, as shown in FIG. 3, the block refers to a plurality of NAND strings 20 in a column direction connected to the word lines WL0 to WLn−1 interposed between the selection gate transistors S1 and S2.

As described above, in the first embodiment, when a word-line leakage current varies due to the change in ambient temperature, the first leakage current flowing through the adjuster 33 is adjusted accordingly. Therefore, the second leakage current flowing to the detection voltage generator 31 can be made almost constant irrespective of an ambient temperature. In this way, it is possible to compare the voltage VMON with the reference voltage VREF to generate the flag signal FLG without being affected by an ambient temperature, thereby accurately performing the determination of a word-line leakage fault.

Second Embodiment

A second embodiment which will be described below relates to circuit technology for accurately detecting a word-line leakage current. Although it is possible to carry out the second embodiment combined with the first embodiment described above, it is possible to carry out the second embodiment only.

Figure 10:
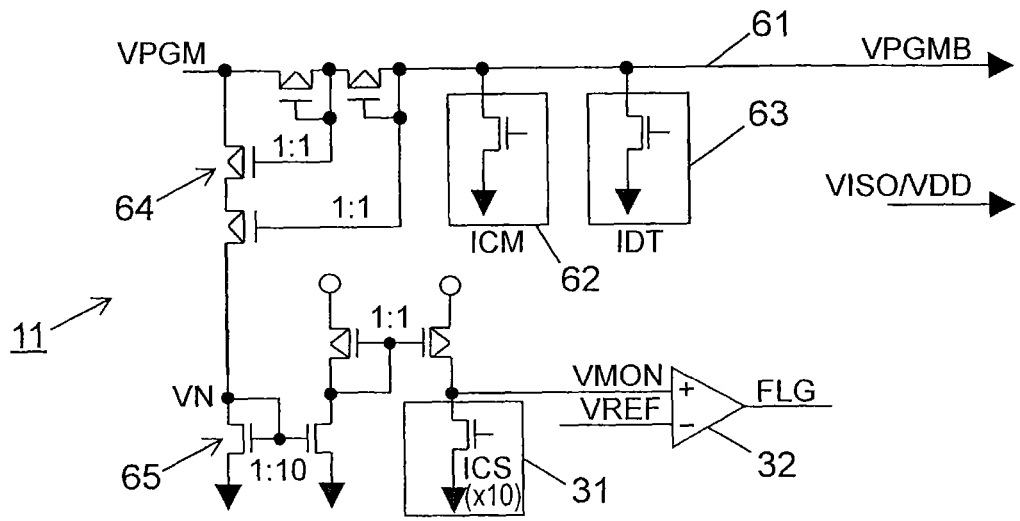
FIG. 10 is a block diagram of a word-line leakage detector 11 according to a second embodiment.

FIG. 10 is a circuit diagram of a word-line leakage detector 11 according to the second embodiment. The word-line leakage detector 11 of FIG. 10 has an ICM circuit 62, an IDT circuit 63, and a first current mirror circuit 64 each connected to a leakage path 61 of a word line, a second current mirror circuit 65 connected to the first current mirror circuit 64, a detection voltage generator 31 connected to the second current mirror circuit 65, and a comparator 32.

The first current mirror circuit 64 makes a current proportional to a current on a leakage path flow to the second current mirror circuit 65. However, when the word-line leakage current is zero, the first current mirror circuit 64 cannot make a current flow to the second current mirror circuit 65. Then, the ICM circuit 62 performs an operation to make a least amount of current flow to the leakage path. The IDT circuit 63 performs an operation to make a current for difference detection flow to the leakage path.

Figure 11:
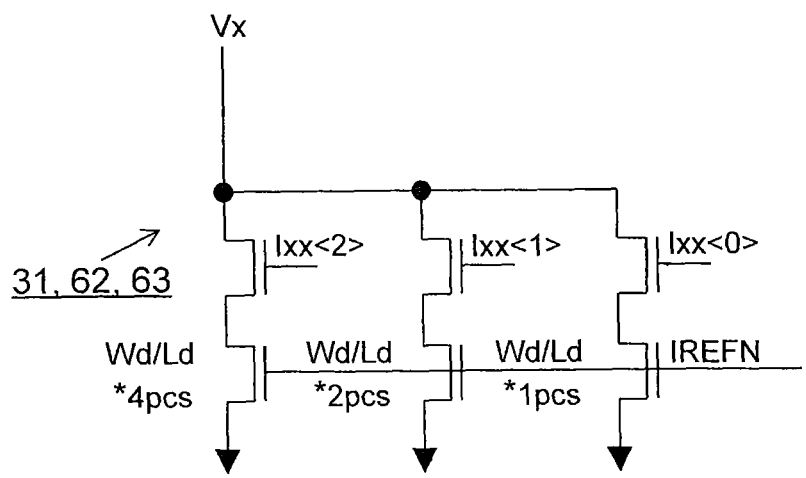
FIG. 11 is a circuit diagram of a detection voltage generator.

Each of the ICM circuit 62, the IDT circuit 63, and the detection voltage generator 31 operates to switch the value of a current to be flown to a leakage path, with input data Ixx[0: 2], for example as shown in FIG. 11. An Ixx signal of FIG. 11 represents an ICM signal for the ICM circuit 62 and an IDT signal for the IDT circuit 63.

The second current mirror circuit 65 has a current mirror ratio of, for example, 1:10 to increase a current flowing through the first current mirror circuit 64, for example, by 10 times, the increased current being supplied to the detection voltage generator 31.

As shown in FIG. 11, the detection voltage generator 31 is provided with a plurality of transistors. While switching the bit value of an ICS signal to be input to the gate of each of these transistors in succession, the detection voltage generator 31 performs comparison by using the comparator 32. The comparator 32 outputs a flag signal FLG that indicates a comparison result. The ICS signal corresponds to the IDAC signal of FIG. 3.

When detecting a word-line leakage current, firstly, a current flows through the ICM circuit 62 and the IDT circuit 63 without connecting a word line thereto. While a current is flowing through the ICM circuit 62 and the IDT circuit 63, a bit value of the ICS signal at which the flag signal FLG is inverted is detected. Then, a word line is connected to the ICM circuit 62 and the IDT circuit 63 without making a current flow to the IDT circuit 63. While no current is flowing through the IDT circuit 63, a bit value of the ICS signal at which the flag signal FLG is inverted is detected. When a leakage current is larger in the state in which a word line is connected to the ICM circuit 62 and the IDT circuit 63 without making a current flow to the IDT circuit 63, it is found that a word line leakage is happening.

Since a plurality of transistors are connected to a VMON node of the comparator 32, the parasitic capacitance becomes larger. Moreover, since a voltage difference between a voltage VMON and a reference voltage VREF is very small, it takes time for the comparator 32 to perform a comparison operation.

Therefore, in this embodiment, the second current mirror circuit 65 is provided to increase a current flowing through the detection voltage generator 31. A current flowing through the detection voltage generator 31 is increased to make the voltage VMON stable early for a high-speed detection operation.

In more detail, the second current mirror circuit 65 multiplies a current from the first current mirror circuit 64 by 10 and then returns the multiplied current at 1:1 to supply it to the detection voltage generator 31.

In order to operate the word-line leakage detector 11 of FIG. 10, for example, a high programming voltage VPGM is applied to either of two adjacent word lines while a low VISO/VDD voltage is applied to the other. In this case, for example, the programming voltage VPGM is about 15 volts and the VISO/VDD voltage is in the range from about 3 volts to 0 volts.

In FIG. 10, the leakage path 61 of a word line to which the word-line leakage detector 11 is connected is a current path at a word line side to which a high voltage is applied.

Figure 12:
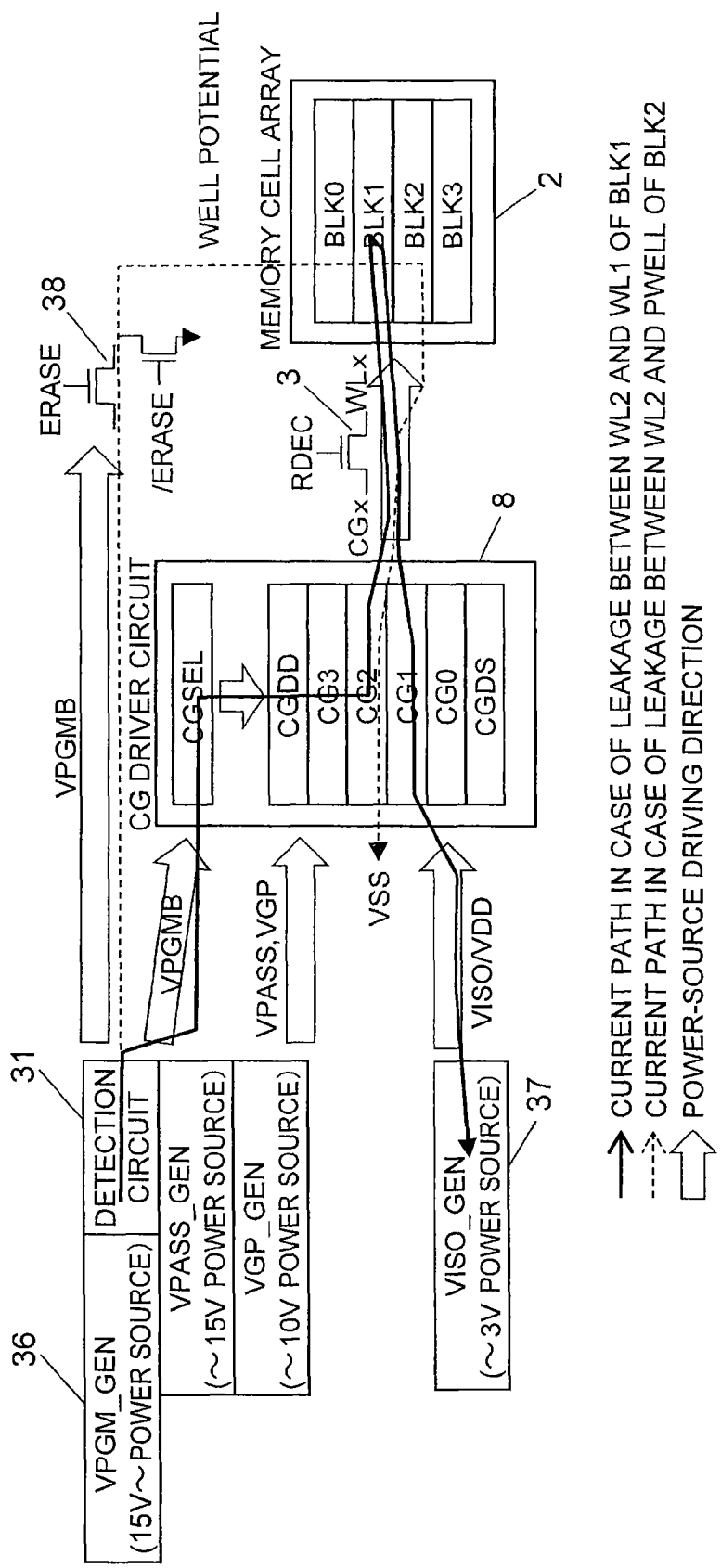
FIG. 12 is a view schematically showing a leakage path 61 in the second embodiment.

FIG. 12 is a view schematically showing the leakage path 61 in the second embodiment. A solid-line arrow path of FIG. 12 indicates a current path in the case where there is a leakage path between adjacent two word lines WL1 and WL2. As shown, a current flows from a VPGM source 36 that generates a programming voltage VPGM to the detection voltage generator 31, the CG driver 8, the row decoder 3, and a leakage path between the word lines WL1 and WL2 in order, and again flows through the row decoder 3 and the CG driver 8 to a VISO power supply 37.

A broken-line arrow path of FIG. 12 indicates a current path in the case where there is a leakage path between the word line WL2 and a PWELL region of the substrate. As shown, a current flows from the VPGM source 36 to the detection voltage generator 31, a transistor 38 for erasure, the PWELL region, a word line, the row decoder 3, and the CG driver 8 in order, and then flows to a ground node VSS.

As described above, in the second embodiment, the second current mirror circuit 65 is provided on the leakage path 61. A leakage current on the leakage path 61 is multiplied and then supplied to the detection voltage generator 31. Therefore, it is possible to achieve a high-speed leakage current detection process at the detection voltage generator 31. Moreover, since a current flowing through the detection voltage generator 31 increases, the accuracy of leakage current detection is improved, with little noise effect.

Third Embodiment

In the second embodiment described above, the word-line leakage detector 11 is connected to the word line side to which a high voltage is applied. At the word line side to which a high voltage is applied, there is large junction leakage from the sources/drains of transistors in the row decoder 3 to the substrate.

Therefore, in a third embodiment which will be described below, a word-line leakage detector 11 is connected to the word line side to which a low voltage is applied, which is one of adjacent two word lines to which a high voltage and a low voltage are applied.

Figure 13:
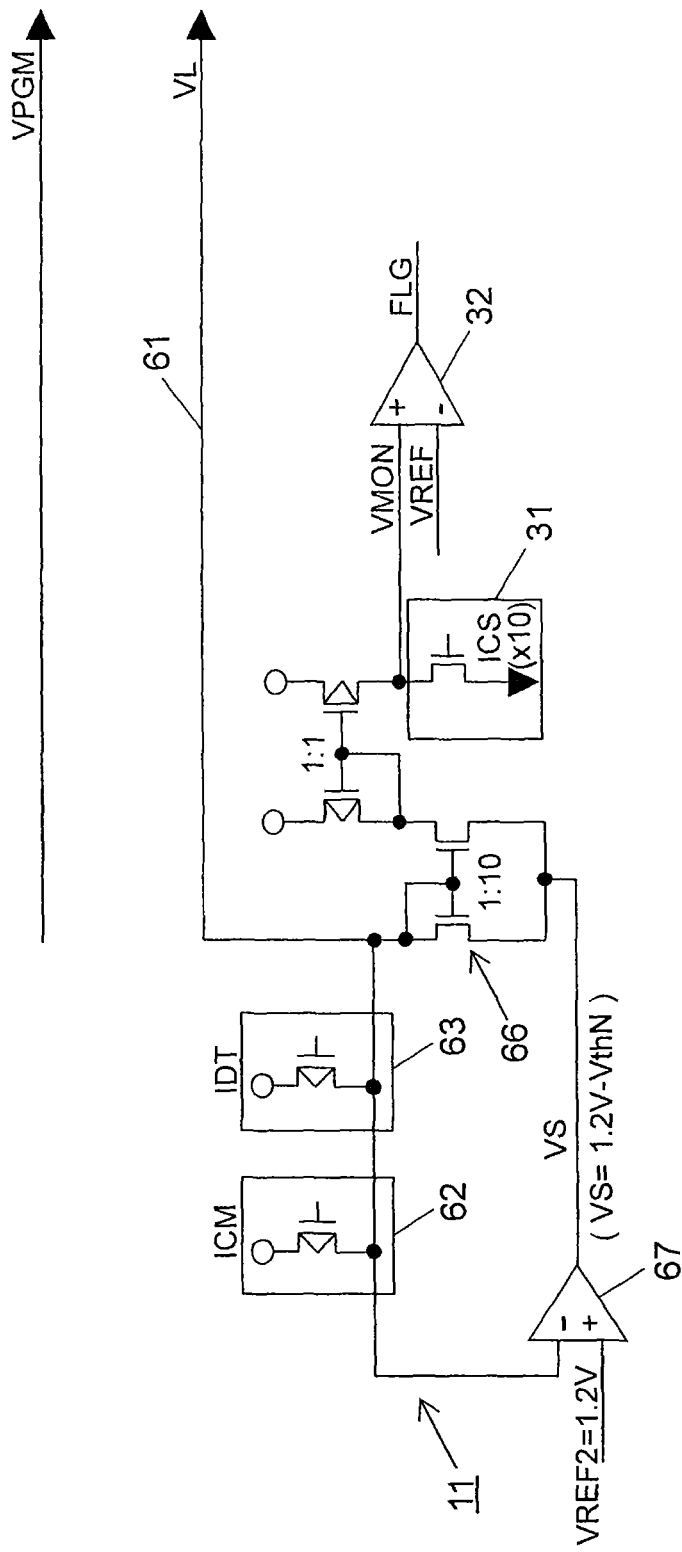
FIG. 13 is a circuit diagram of a word-line leakage detector 11 according to a third embodiment.

FIG. 13 is a circuit diagram of a word-line leakage detector 11 according to the third embodiment. The word-line leakage detector 11 of FIG. 13 is connected to the word line side to which a low voltage is applied. The word-line leakage detector 11 of FIG. 13 has an ICM circuit 62, an IDT circuit 63, a current mirror circuit 66, a detection voltage generator 31, a comparator 32, and a low-voltage setting circuit 67.

Like the second current mirror circuit 65 of FIG. 10, the current mirror circuit 66 has a current mirror ratio of, for example, 1:10 to increase a leakage current by 10 times and supply the increased current to the detection voltage generator 31.

The low-voltage setting circuit 67 controls in feedback manner a voltage VS at a low-voltage side node of the current mirror circuit 66 so as to give a voltage VL on a leakage path 61 at a low-voltage side of a word line equal to a reference voltage VREF2.

Figure 14:
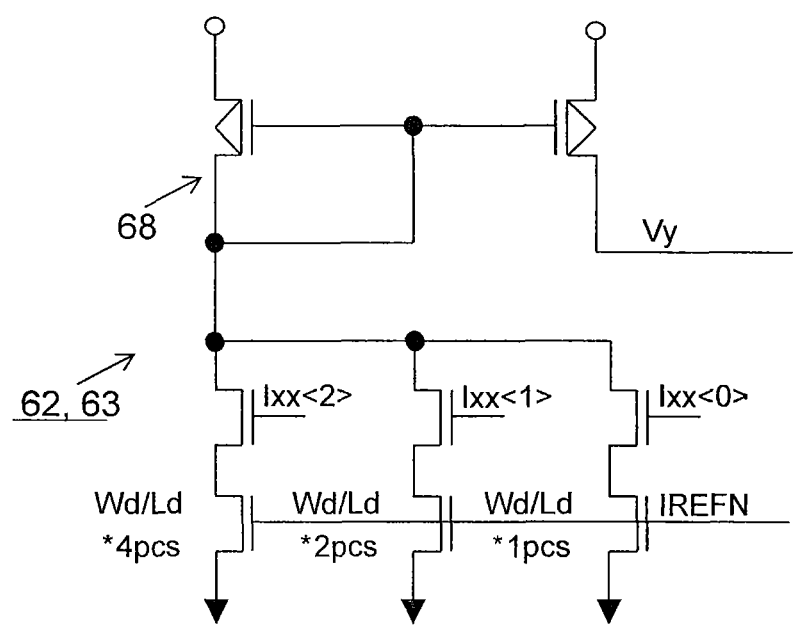
FIG. 14 is a circuit diagram showing an example of an ICM circuit 62 and an IDT circuit 63.

FIG. 14 is a detailed circuit diagram of the ICM circuit 62 and the IDT circuit 63. The circuit of FIG. 14 is provided with a current mirror circuit 68 in addition to the circuit of FIG. 11. A voltage Vy of FIG. 14 corresponds to a voltage VL of FIG. 13. As shown in FIG. 14, the ICM circuit 62 and the IDT circuit 63 can switch a current in eight patterns by varying the bit values of gate signals ICM[0:2] and a gate signal IDT[0:2] of every three transistors, respectively.

Figure 15:
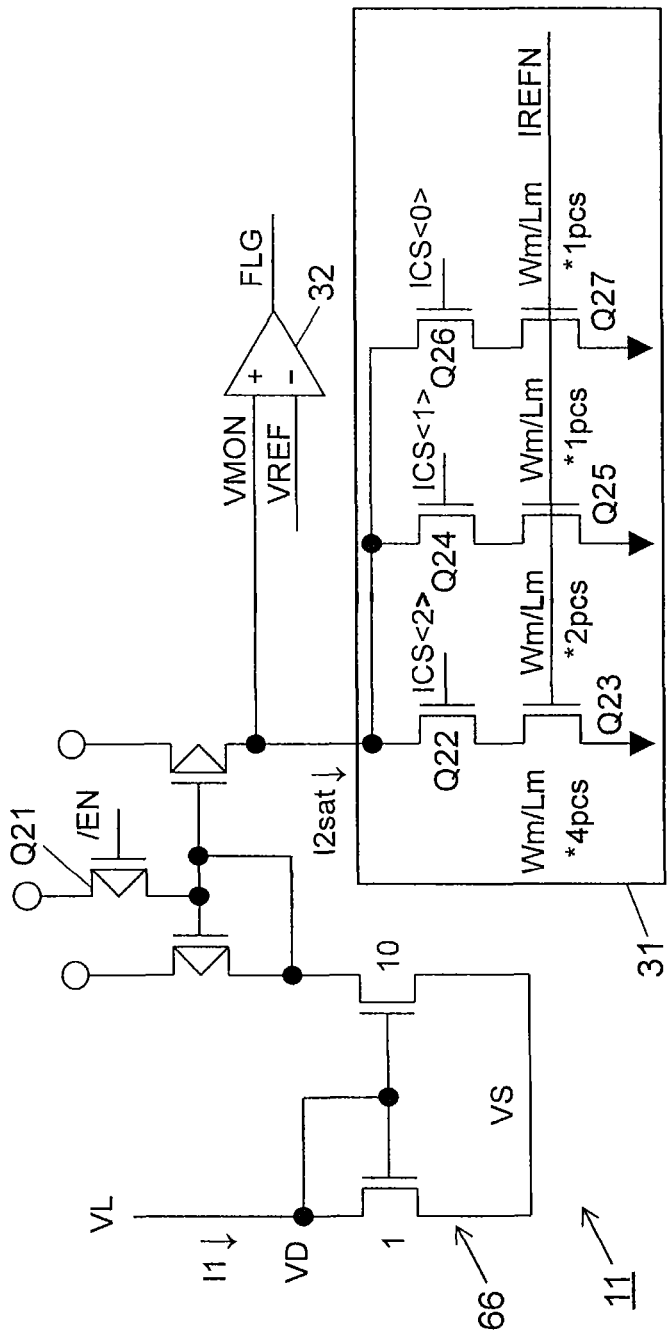
FIG. 15 is a circuit diagram of a more detailed version of the circuit of FIG. 13.

FIG. 15 is a circuit diagram of a more detailed version of the circuit of FIG. 13. The circuit of FIG. 15 is different from the circuit of FIG. 13 in that it is provided with a PMOS transistor Q21 for setting whether to perform leakage current detection by an enable signal /EN, and a detection voltage generator 31 having a specific internal configuration.

The detection voltage generator 31 of FIG. 15 adjusts the amount of a current to be flown from a leakage path to transistors Q22 to Q27, in accordance with the bit value of ICS [0:2] from the controller 6.

Figure 16:
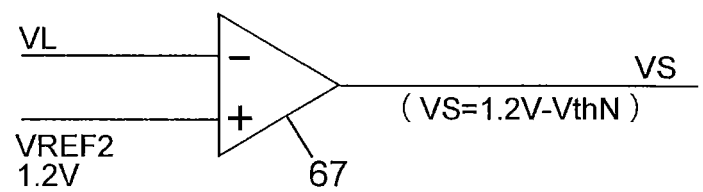
FIG. 16 is a view showing an example of a circuit connected to a voltage VS of FIG. 15.

The lower voltage side of the current mirror circuit of FIG. 15 is set to a voltage VS. Like shown in FIG. 13, the voltage VS may be generated by using a differential amplifier 67 such as shown in FIG. 16 or may be set to a ground voltage VSS. When the voltage VS is set to the ground voltage VSS, there is an advantage in that the circuit is simplified, however, a voltage of a VL node on a leakage path 61 may be varied by the threshold voltage of a transistor in the current mirror circuit. On the other hand, when the differential amplifier 67 of FIG. 16 controls in feedback manner the voltage VS, it is possible to hold the voltage of the VL node to be applied to a word line WL to be almost constant irrespective of variation in fabrication process to perform stable measurements.

Figure 17:
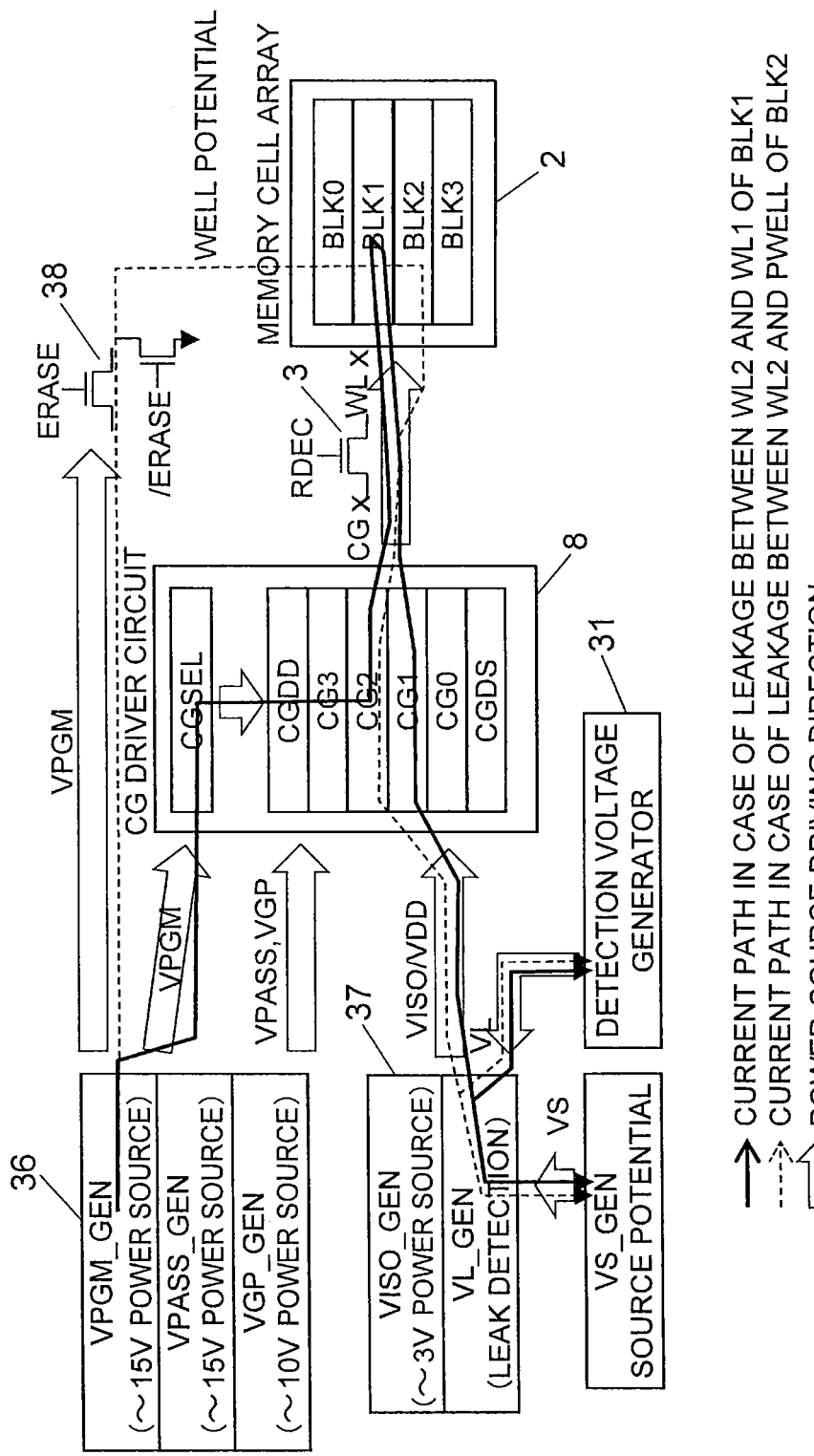
FIG. 17 is a view schematically showing a leakage path 61 in the second embodiment.

FIG. 17 is a view schematically showing the leakage path 61 in the third embodiment. A solid-line arrow path of FIG. 17 indicates a current path in the case where there is a leakage current between adjacent two word lines WL1 and WL2. As shown, a current flows from the VPGM source 36 to the CG driver 8, the row decoder 3, and a leakage path between the word lines WL1 and WL2 in order, and again flows through the row decoder 3 and the CG driver 8 to reach a low-voltage VL node. The current that has reached the low-voltage VL node is divided into to two currents to flow to the voltage VS node and the detection voltage generator 31, respectively. In this way, the order of paths of current flow to the detection voltage generator 31 is different from that of FIG. 12.

A broken-line arrow path of FIG. 17 indicates a current path in the case where there is a leakage path between the word line WL2 and a PWELL region of the substrate. The broken-line arrow path of FIG. 17 is the same as that of FIG. 12 except for the order of paths of current flowing to the detection voltage generator 31.

As described above, in the third embodiment, the word-line leakage detector 11 is connected to the word line side to which a low voltage is applied. Therefore, there is no effect of junction leakage by the row decoder 3 on the leakage path 61, and hence a word-line leakage current can be accurately detected.

Fourth Embodiment

When the voltage VMON generated by the detection voltage generator 31 is compared with the reference voltage VREF by the comparator 32, since a voltage difference between the voltages is very small, the flag signal FLG output from the comparator 32 may vary due to noises.

Therefore, in a fourth embodiment which will be described below, the switching cycle of the controller 6 to switch the bit value of ICS[0:2] in succession is set to be longer. Moreover, the flag signal FLG is sampled a plurality of times within the prolonged cycle to measure the number of times of occurrence of the flag signal FLG becoming a high level, thereby determining whether there is a leakage fault based on the number of times of occurrence.

Figure 18:
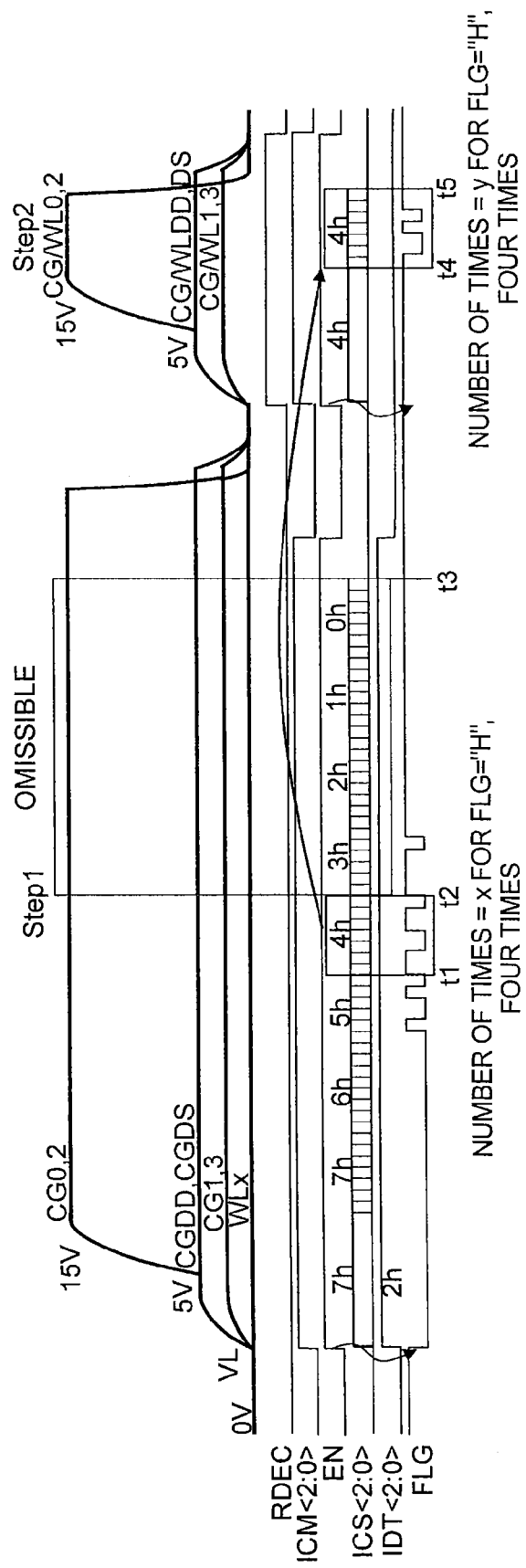
FIG. 18 is a timing chart of a word-line leakage detector 11 according to a fourth embodiment.

FIG. 18 is a timing chart of a word-line leakage detector 11 according to the fourth embodiment. In FIG. 18, the controller 6 varies ICS[0:2] by one bit each time from 7 h to 0 h and performs seven times the detection of whether the flag signal FLG is a high level during a period in which ICS[0:2] is set to a certain bit value. Then, the controller 6 stores a bit value of ICS[0:2] at which the number of times that the flag signal FLG becomes a high level is, for example, four or more, and its number of times x (time t1 to t2). After the bit value and the number of times x have been stored, since the bit value of ICS[0:2] is not required to be varied, time t2 to t3 may be omitted.

Next, this time, while ICS[0:2] is being set to the stored bit value, the number of times y that the flag signal FLG becomes a high level during a period having the same duration as the above-mentioned period is measured (time t4 to t5).

If x≥y, it is determined that there is no leakage fault. On the other hand, if x<y, it is determined that there is a leakage fault.

As described above, in the timing chart of FIG. 18, under consideration of possibility of change in logic of the flag signal FLG due to noises or the like, it is determined whether there is a leakage fault based on the number of times that the flag signal FLG becomes, for example, a high level. Therefore, it is possible to prevent influence by noises of the flag signal FLG.

Figure 19:
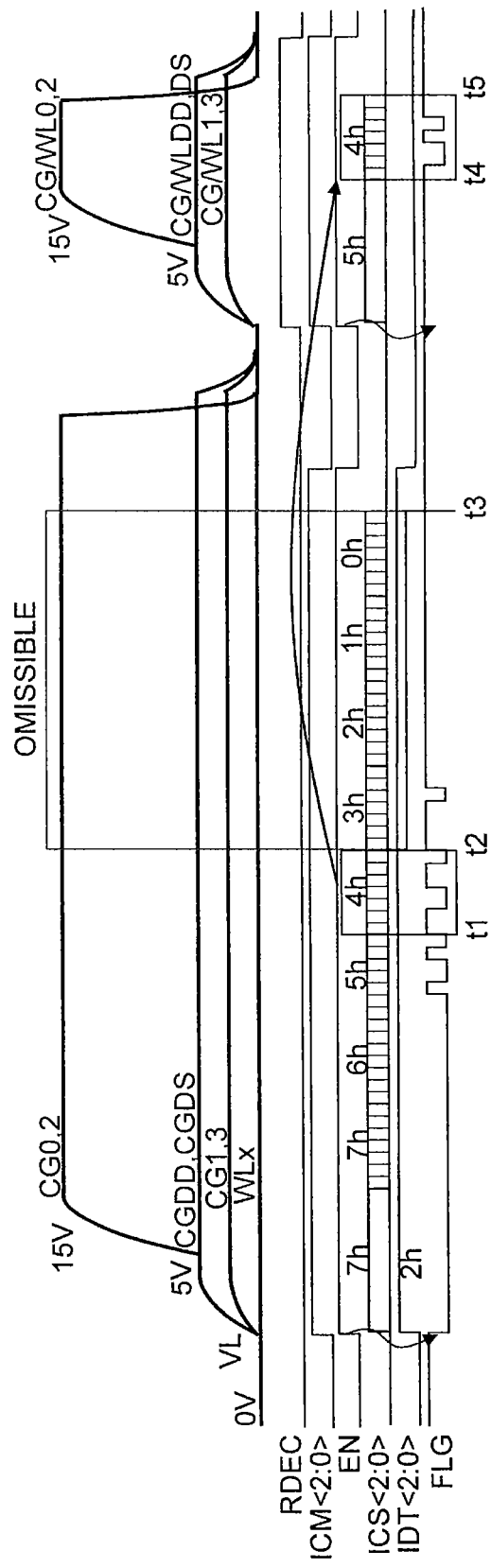
FIG. 19 is a timing chart according to a first modification of FIG. 18.

FIG. 19 is a timing chart according to a first modification of FIG. 18. At time t4, before the stored ICS[0:2]=4 h is set, 5 h that is the value just before 4 h is set once. This is because of making waveform behavior resemble that during time t1 to t2 as close as possible. In this way, by reflecting the record of the previous operation state, a leakage current can be detected more accurately.

Figure 20:
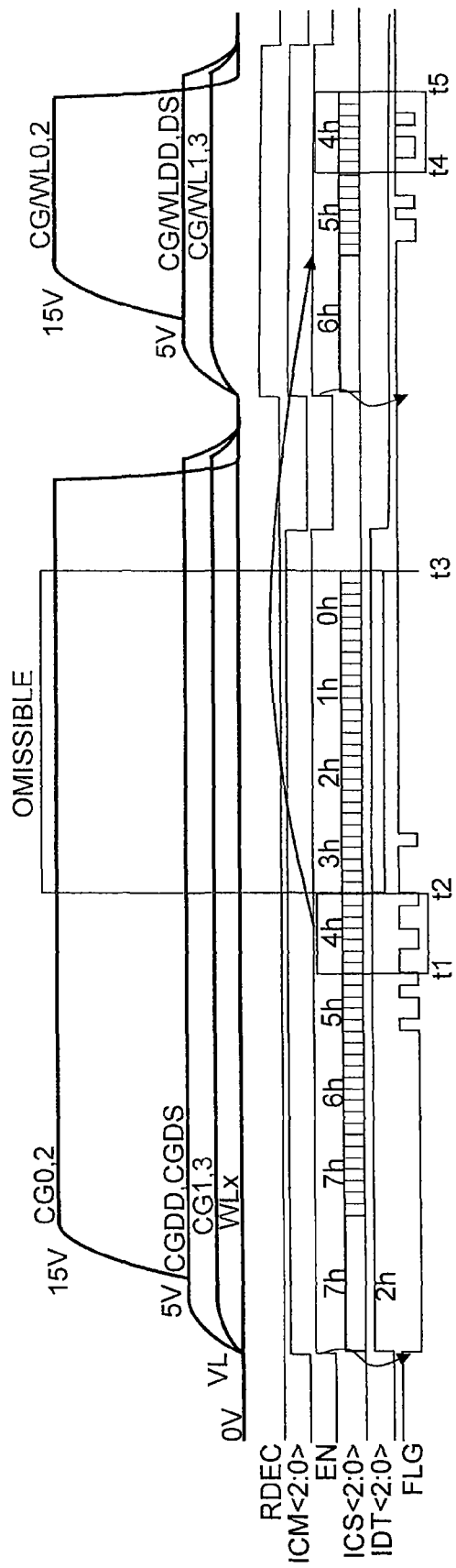
FIG. 20 is a timing chart according to a second modification of FIG. 18.

FIG. 20 is a timing chart according to a second modification of FIG. 18. In FIG. 20, setting is made with record information one more previous to that of FIG. 19. Before ICS[0:2]=4 h is set, 6 h is set first and then 5 h is set, and thereafter 4 h is set. In this way, the record of past operation state is correctly reflected to improve leakage-current detection accuracy.

As described above, in the fourth embodiment, when the number of times x that the flag signal FLG becomes a high level reaches a predetermined threshold value, its number of times x and the bit value of ICS[0:2] at that number are stored. Next, the bit value is set again to measure the number of times y that the flag signal FLG becomes a high level. By comparing the number of times x and y, it is determined whether a leakage fault has occurred. In this way, it is determined whether there is a leakage fault for average number of times, and hence the determination is hardly affected by noises of the flag signal FLG.

Fifth Embodiment

Figure 21:
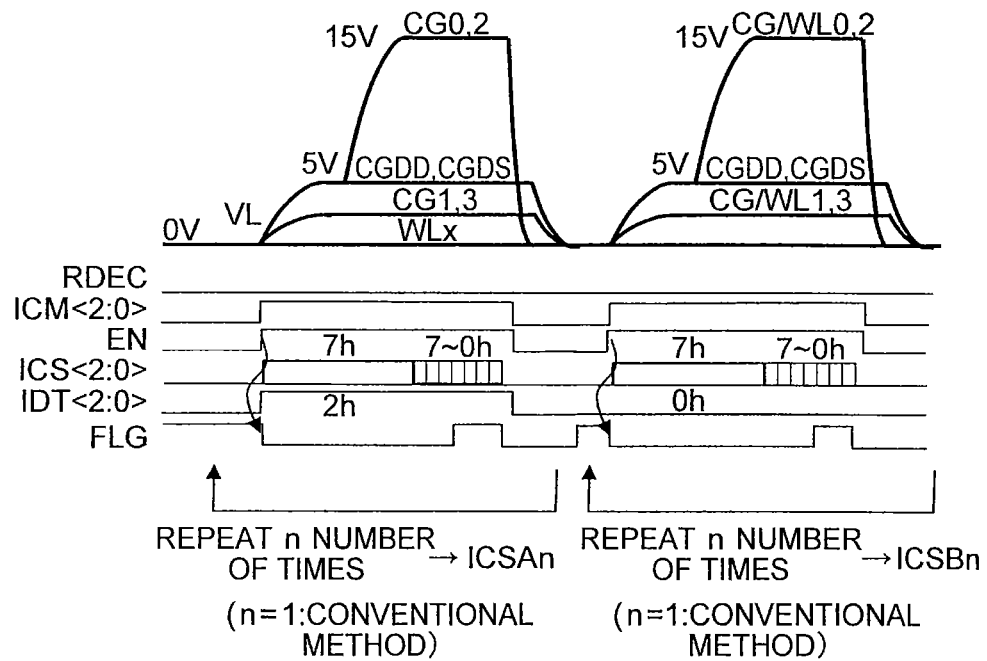
FIG. 21 is a timing chart of a word-line leakage detector 11 according to a fifth embodiment.

FIG. 21 is a timing chart of a word-line leakage detector 11 according to a fifth embodiment. In FIG. 21, while no voltage is being applied to a word line WL, IDT[0:2] is set to 2 h and ICS[0:2] is decreased from 7 h to 0 h. Then, the bit value of ICS[0:2] at which a flag signal FLG is changed from a low to a high level is set to ICSAn.

n (n is an integer of 2 or more) is a trial number of times to obtain measured values for the trial number of times.

Next, while a voltage is being applied to the word line WL, IDT[0:2] is set to 0 h and ICS[0:2] is decreased from 7 h to 0 h. In the same way as above, the bit value of ICS[0:2] at which a flag signal FLG is changed from a low to a high level is set to ICSBn.

If $\Sigma ICSAn \geq \Sigma ICSBn$, it is determined that there is no leakage fault. On the other hand, if $\Sigma ICSAn < \Sigma ICSBn$, it is determined that there is a leakage fault. This is equivalent to comparison between $\Sigma ICSAn/n$ and $\Sigma ICSBn/n$, that is, average-value comparison. As described, in the fifth embodiment, an averaging technique is used to improve detection accuracy. In general, when a measurement error shows a standard normal distribution of a standard deviation $\sigma$, an averaging technique with the trial number of times n can be used to convert the standard deviation $\sigma$ into $\sigma/\sqrt{n}$.

For example, by using an average value in 4-time measurements, detection accuracy can be raised two times higher. In this embodiment, the trial is performed two times on ICSAn and ICSBn. Therefore, a combined standard deviation $\sigma ICS0$ is expressed as $\sqrt{((\sigma ICSA)^2 + (\sigma ICSB)^2)}$ that is mean square, by using standard deviations $\sigma ICSA$ and $\sigma ICSB$. If $\sigma ICSA = \sigma ICSB = \sigma ICSAB$, $\sigma ICS0 = \sqrt{2} \times \sigma ICSAB$ is given.

In the fifth embodiment described above, the trial number of times is set to the same n number of times for ICSA and ICSB. However, the trial number of times may be set to different number of times, such as, an n number of times for ICSA and an m number of times for ICSB ($n \neq m$).

The determination in this case is such that, if $\Sigma ICSAn/n \geq \Sigma ICSBm/m$, it is determined that there is no leakage fault. On the other hand, if $\Sigma ICSAn/n < \Sigma ICSBm/m$, it is determined that there is a leakage fault.

ICSA is a current that does not depend on a selected block. Even if a selected block is changed, a measured result can be used again as long as a chip temperature, a power supply voltage, etc. do not vary, thereby shortening a test time.

ICSB is a current that depends on a selected block. Therefore, if m is increased to raise ICSB measurement accuracy, although a chip test time is increased as proportional to m×(the number of blocks), it is possible to restrict the increase in test time for ICSA to the degree of increase proportional to n by using a measured result again.

Therefore, n is easier to be increased compared to m. With adjustments to n and m, a test time and measurement accuracy can be adjusted.

The second to fifth embodiments described above can be combined with the first embodiment. That is, by adding the adjuster 33 described in the first embodiment to the word-line leakage detector 11 of each of the second to fifth embodiments, it is possible to generate a flag signal FLG for determining whether there is a leakage current irrespective of an ambient temperature.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a plurality of memory cells connected to each of a plurality of word lines;
a word-line leakage detector configured to detect a leakage current generated on at least one of the plurality of word lines; and
a controller configured, when a leakage current is detected by the word-line leakage detector, to determine that a block including a memory cell connected to a word line through which the leakage current flows is defective,
wherein the word-line leakage detector comprises:
a detection voltage generator configured to generate a detection voltage in accordance with the leakage current;
a comparator configured to generate a flag signal having output logic inverted depending on whether the detection voltage exceeds a predetermined threshold voltage; and
an adjuster configured to adjust a current amount by diverting part of the leakage current in accordance with an ambient temperature.

2. The device of claim 1, wherein the adjuster increases a current amount of the leakage current to be diverted as the ambient temperature rises.

3. The device of claim 1, wherein the leakage current includes a first leakage current flowing through the adjuster and a second leakage current flowing through the detection voltage generator,
wherein the adjuster adjusts the first leakage current in accordance with an ambient temperature so that the second leakage current becomes closer to a constant value irrespective of the ambient temperature.

4. The device of claim 3, wherein the adjuster adjusts the first leakage current step by step based on correspondence in accordance with an ambient temperature.

5. The device of claim 1 further comprising a temperature sensor that measures the ambient temperature.

6. The device of claim 1, wherein:
the plurality of memory cells are a plurality of NAND flash memory cells, and
the controller acknowledges that a block of a plurality of NAND flash memory cells selectable by a plurality of word lines arranged between a drain-side selection gate line and a source-side selection gate line is defective when the leakage current is detected in the block.

7. The device of claim 1, wherein the word-line leakage detector detects at least one of a leakage current flowing through adjacent word lines, a leakage current flowing downward in a substrate direction from a word line, and a leakage current flowing upward to a wiring layer from a word line.

8. The device of claim 1, wherein the word-line leakage detector comprises a current mirror circuit that generates a current obtained by multiplying a current in accordance with a leakage current flowing through a word line by k (k being a real number larger than 1) times,
wherein the word-line leakage detector generates the detection voltage based on the k-time increased current generated by the current mirror circuit.

9. The device of claim 8, wherein, when detecting a leakage current flowing between adjacent two word lines, the word-line leakage detector applies a high voltage to one of the two word lines and a low voltage to the other, and
the current mirror circuit generates a current obtained by multiplying a leakage current flowing through a leakage path at a word line side to which a low voltage is applied by K times.

10. The device claim 9, wherein a low voltage node of the current mirror circuit is set to a ground voltage.

11. The device of claim 9, wherein the low voltage node of the current mirror circuit is controlled in feedback manner so that a voltage on a leakage path at a word line side to which a low voltage is applied becomes equal to a predetermined reference voltage.

12. The device of claim 1, wherein the controller determines whether a leakage fault occurs to a word line depending on whether the number of times that the flag signal becomes a predetermined logic within a predetermined period exceeds a predetermined reference number of times.

13. The device of claim 12, wherein the detection voltage generator generates the detection voltage based on a variable control signal supplied from the controller, and the controller stores, when a number of times that the flag signal becomes a predetermined logic within the predetermined period exceeds the reference number of times, the exceeded number of times, and thereafter, supplies the control signal at a time at which the number of times that the flag signal becomes the predetermined logic within the predetermined period exceeds the reference number of times to the detection voltage generator to determine whether a leakage fault occurs to a word line by comparing the number of times that the flag signal becomes the predetermined logic within the predetermined period with the stored number of times.

14. The device of claim 13, wherein, before supplying the control signal at the time of exceeding the reference number of times to the detection voltage generator, the controller supplies a control signal that is at least just before the control signal at the time of exceeding the reference number of times to the detection voltage generator.

15. The device of claim 1, wherein the detection voltage generator adjusts a voltage level of the detection voltage with a bit value of a detection voltage control signal, and the controller determines whether a leakage fault occurs to a word line by using a value obtained by measuring and averaging bit values of the detection voltage control signal for which the flag signal becomes a predetermined logic, for a specific number of times of trials.

16. The device of claim 15, wherein the controller determines whether a leakage fault occurs to a word line by comparing a value obtained by measuring and averaging bit values of the detection voltage control signal for which the flag signal becomes a predetermined logic in a state in which no voltage is supplied to the word line, for a first number of times of trials, and a value obtained by measuring and averaging bit values of the detection voltage control signal for which the flag signal becomes the predetermined logic in a state in which a voltage is supplied to the word line, for a second number of times of trials different from the first number of times of trials.

17. The device claim 16, wherein the controller uses a value obtained by measuring and averaging bit values for the first the number of times of trials while a chip temperature and a chip voltage do not vary.

18. A method of determining defectiveness of a semiconductor memory device having a plurality of word lines, comprising:

detecting a leakage current generated on at least one of the plurality of word lines;

generating a detection voltage in accordance with the leakage current;

comparing the detection voltage and a predetermined threshold voltage to determine whether the detection voltage exceeds the predetermined threshold voltage; and determining that a block including a memory cell connected to a word line for which the detection voltage exceeds the predetermined threshold voltage is defective, wherein a current amount is adjusted by diverting part of the leakage current in accordance with an ambient temperature.

* * * * *